(12) United States Patent
Kulkarni et al.

(10) Patent No.: US 9,448,259 B2
(45) Date of Patent: Sep. 20, 2016

(54) APPARATUSES AND METHODS TO DISTINGUISH PROPRIETARY, NON-FLOATING AND FLOATING CHARGERS FOR REGULATING CHARGING CURRENTS

(71) Applicant: QUALCOMM Incorporated, San Diego, CA (US)

(72) Inventors: Ameya Kulkarni, San Diego, CA (US); Devdutt Patnaik, San Diego, CA (US); Terrence Brian Remple, San Diego, CA (US); Jay Yu Jae Choi, San Diego, CA (US); Madjid Abdul Hamidi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 148 days.

(21) Appl. No.: 14/328,093

(22) Filed: Jul. 10, 2014

(65) Prior Publication Data

US 2016/0011238 A1    Jan. 14, 2016

(51) Int. Cl.
| | |
|---|---|
| *H01M 10/44* | (2006.01) |
| *H01M 10/46* | (2006.01) |
| *G01R 17/02* | (2006.01) |
| *G01R 19/00* | (2006.01) |
| *H02J 7/00* | (2006.01) |
| *G06F 13/38* | (2006.01) |

(52) U.S. Cl.
CPC ........... *G01R 17/02* (2013.01); *G01R 19/0092* (2013.01); *G06F 13/387* (2013.01); *H02J 7/007* (2013.01); *H02J 7/0052* (2013.01); *H02J 2007/0062* (2013.01)

(58) Field of Classification Search
CPC .............. H02J 2007/00017; H02J 2007/0021; H02J 7/0026; H02J 2007/0096

USPC ......................... 320/107, 111, 114, 115, 137
See application file for complete search history.

(56) References Cited

U.S. PATENT DOCUMENTS 9,201,480 B2 * 12/2015 Fischbach ............... G06F 1/266
2010/0219790 A1    9/2010 Chadbourne et al.
(Continued)

OTHER PUBLICATIONS

Fairchild Semiconductor Corporation, "FSA831—USB2.0 High-Speed (480Mbps) Charger Detection with Isolation Switch," FSA831, Rev. 1.0.2, Jul. 2013, < URL: http://www.fairchildsemi.com/ds/FS/FSA831.pdf >, pp. 01-11.
(Continued)

*Primary Examiner* — Edward Tso
(74) *Attorney, Agent, or Firm* — Withrow & Terranova, PLLC

(57) ABSTRACT

Apparatuses and methods to distinguish proprietary, non-floating and floating chargers for regulating charging current are disclosed. In one aspect, a charger detection circuit is provided in a portable electronic device. The charger detection circuit is configured to detect whether a connected Universal Serial Bus (USB) charger is compliant with a USB battery charging specification. If the connected USB charger is non-compliant with the USB battery charging specification, the charger detection circuit is configured to further detect if the non-complaint USB charger is a non-compliant floating USB charger or a non-compliant proprietary USB charger. If the connected USB charger is determined to be a non-compliant proprietary USB charger, the portable electronic device can be configured to draw up to a maximum charging current according to the USB battery charging specification.

30 Claims, 11 Drawing Sheets

(56) References Cited

U.S. PATENT DOCUMENTS

2012/0119696 A1  5/2012  Picard
2012/0198101 A1  8/2012  Porcella et al.
2012/0210146 A1  8/2012  Lai et al.
2012/0242282 A1  9/2012  Wada et al.
2013/0082644 A1  4/2013  Gagne et al.
2013/0154547 A1  6/2013  Wada et al.
2014/0070791 A1  3/2014  Funakoshi

OTHER PUBLICATIONS

Author Unknown, "Battery Charging Specification," USB Implementers Forum, Inc., Revision 1.2, Dec. 7, 2010, 71 pages.
International Search Report and Written Opinion for PCT/US2015/039691, mailed Oct. 2, 2015, 11 pages.
Second Written Opinion for PCT/US2015/039691, mailed Jun. 28, 2016, 5 pages.

* cited by examiner

APPARATUSES AND METHODS TO DISTINGUISH PROPRIETARY, NON-FLOATING AND FLOATING CHARGERS FOR REGULATING CHARGING CURRENTS

BACKGROUND

I. Field of the Disclosure

The technology of the disclosure relates generally to charging a battery of portable electronic devices from Universal Serial Bus (USB) chargers.

II. Background

Portable electronic devices, such as smartphones, tablets, laptop computers, and the like, can be powered by rechargeable batteries that need to be recharged periodically. Universal Serial Bus (USB) is an industry standard that defines the cables, connectors, and communication protocols for data and power transfers among personal computers and electronic devices. Thus, USB ports have been used as both data transfer and charging ports to charge rechargeable batteries of electronic devices. The convenience of drawing current from USB ports on personal computers has led to the creation of various types of USB chargers designed for charging portable electronic devices using the same USB cables as used for personal computers.

In this regard, FIG. 1 illustrates a typical USB physical connection between a portable electronic device 10 and a USB charger 12. On one end, the portable electronic device 10 is embedded with a receptacle 14. On the other end, the USB charger 12 exposes a USB 3.x receptacle 16. A detachable USB cable 18, with a plug 20 on one end and a plug 22 on the other end, connects the portable electronic device 10 to the USB charger 12. A standard USB receptacle and connector, including the plugs 20, 22, and the receptacles 14, 16 in FIG. 1, have at least VBUS, GND, D−, and D+ pins 24, 26, 28, and 30. This is shown, for example, in the detachable USB cable 18. The VBUS pin 24 and the GND pin 26 are used for charging purposes, while the D− and D+ pins 28, 30 are designed for protocol handshakes and data transfer. The VBUS and GND pins 24, 26 are by design longer than the D− and D+ pins 28, 30, so that the VBUS and GND pins 24, 26 will make contact before the D− and D+ pins 28, 30 when the plugs 22, 20 are attached to the receptacles 14, 16, respectively. The USB 3.x receptacle 16 also contains a SSTX− pin 32, a SSTX+ pin 34, a SSRX− pin 36, and a SSRX+ pin 38 dedicated for USB 3.x Super-Speed connectivity. The SSTX−, SSTX+, SSRX−, and SSRX+ pins 32, 34, 36, and 38 are not used when the plug 20 is attached to the USB 3.x receptacle 16.

In addition to protocol handshakes and data transfer, portable electronic devices use the relative voltage and/or current variations between D− and D+ pins to detect different types of connected USB chargers. A USB charger is deemed standard compliant if configuration and voltages of the D− and D+ pins meet the specifications of USB battery charging specification revision 1.2 (BC1.2), and non-compliant otherwise. BC1.2 defines a plurality of compliant charger categories, including Dedicated Charging Port (DCP), Charging Downstream Port (CDP), and Standard Downstream Port (SDP), among others. Following the BC1.2 algorithm results in most non-compliant chargers being detected as SDP and current draw being limited to a current level specified in BC1.2 (e.g., $I_{SUSP}$.)

SUMMARY OF THE DISCLOSURE

Aspects of the disclosure include apparatuses and methods to distinguish proprietary, non-floating and floating chargers for regulating charging current. Related circuits, systems, and methods are also disclosed. In aspects disclosed herein, a charger detection circuit is provided in a portable electronic device ("portable device") that has one or more Universal Serial Bus (USB) ports that can be used for charging the portable device. The charger detection circuit is configured to detect a connected USB charger connected to the portable device that is compliant with a prescribed battery charging specification so as to draw a charging current according to the battery charging specification. If the charger detection circuit detects that the connected USB charger is non-compliant with the battery charging specification, the charger detection circuit is configured to further detect if the non-complaint USB charger is a non-compliant floating charger or a non-compliant proprietary charger. With detection and categorization of non-compliant USB chargers, the portable device can decide to draw an appropriate level of charging current from a connected non-compliant charger under various use case scenarios.

In this regard in one aspect, a USB charger detection circuit is provided. The USB charger detection circuit comprises a detection control circuit and a comparison circuit. The detection control circuit is configured to initiate a timeout timer in response to receipt of a VBUS signal from a connected USB charger. The timeout timer is configured to generate a timeout output indicative of an expiration of the timeout timer. The comparison circuit is configured to receive a data input signal based on a received USB data pin signal from a connected USB charger and a reference signal that is generated in response to detection of the VBUS signal from the USB charger. The comparison circuit is also configured to generate a comparator output based on a comparison of the data input signal and the reference signal. The detection control circuit is further configured to generate a detection output indicative of the connected USB charger being a proprietary USB charger if the comparator output indicates the data input signal is greater than the reference signal.

In another aspect, a USB charger detection means is provided. The USB charger detection means comprises a detection control means and a comparison means. The detection control means is configured to initiate a timeout timer in response to receipt of a VBUS signal from a connected USB charger. The timeout timer is configured to generate a timeout output indicative of an expiration of the timeout timer. The comparison means is configured to receive a data input signal based on a received USB data pin signal from a connected USB charger and a reference signal that is generated in response to detection of the VBUS signal from the USB charger. The comparison means is also configured to generate a comparator output based on a comparison of the data input signal and the reference signal. The detection control means is further configured to generate a detection output indicative of the connected USB charger being a proprietary USB charger if the comparator output indicates the data input signal is greater than the reference signal.

In another aspect, a method for distinguishing between a proprietary USB charger and a floating USB charger is provided. The method comprises initiating a timeout timer in response to receipt of a VBUS signal from a USB charger and generating a timeout output indicative of an expiration of the timeout timer. The method also comprises receiving a data input signal based on a received USB data pin signal from a connected USB charger, receiving a reference signal generated in response to detection of the VBUS signal from the USB charger, and generating a comparator output based on a comparison of the data input signal and the reference signal. The method further comprises generating a detection output indicative of the connected USB charger being a proprietary USB charger if the comparator output indicates the data input signal is greater than the reference signal. The method further comprises generating the detection output indicative of the connected USB charger being a floating USB charger based on the timeout output indicating the expiration of the timeout timer and the comparator output indicating the data input signal is less than or equal to the reference signal.

DETAILED DESCRIPTION

Figure 1:
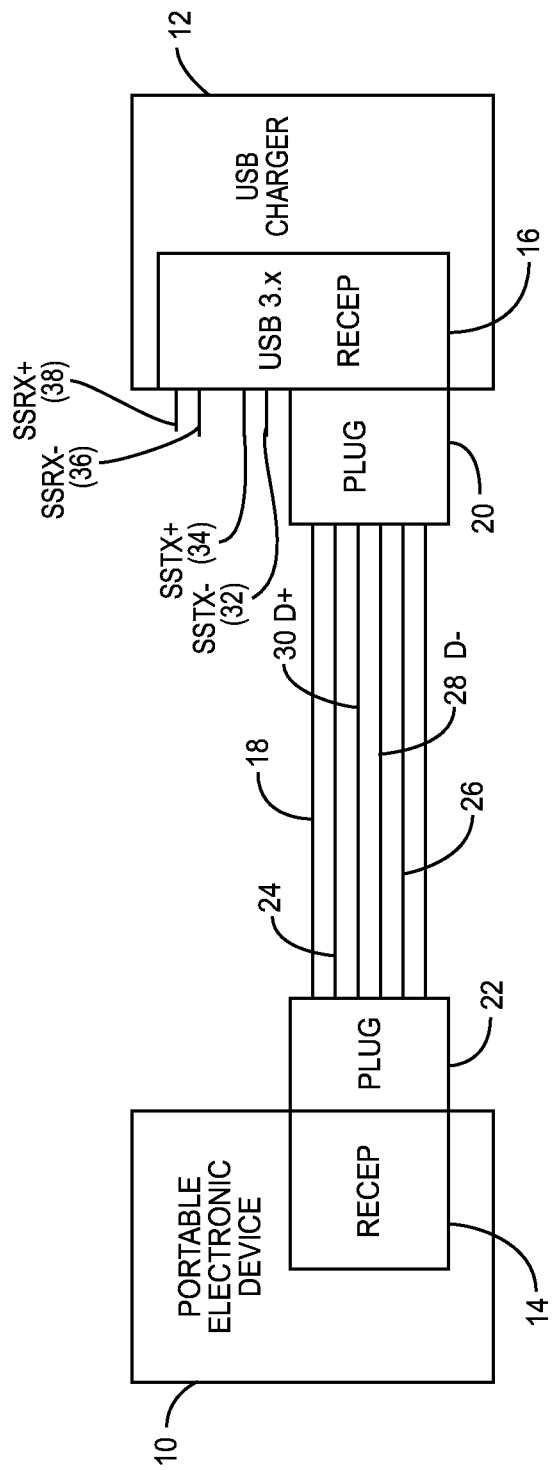
FIG. 1 is a block diagram of an exemplary Universal Serial Bus (USB) physical connection between a portable electronic device and a USB charger.

With reference to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects of the disclosure include apparatuses and methods to distinguish proprietary, non-floating and floating chargers for regulating charging current. Related circuits, systems, and methods are also disclosed. In aspects disclosed herein, a charger detection circuit is provided in a portable electronic device ("portable device") that has one or more USB ports that can be used for charging the portable device. The charger detection circuit is configured to detect a connected USB charger connected to the portable device that is compliant with a prescribed USB battery charging specification so as to draw a charging current according to the USB battery charging specification. If the charger detection circuit detects that the connected USB charger is non-compliant with the USB battery charging specification, the charger detection circuit is configured to further detect if the non-complaint USB charger is a non-compliant floating charger or a non-compliant proprietary USB charger based on a detection algorithm that is compliant with the battery charging specification. With detection and categorization of non-compliant USB chargers, the portable device can decide to draw an appropriate level of charging current from a connected non-compliant charger under various use case scenarios.

Figure 2:
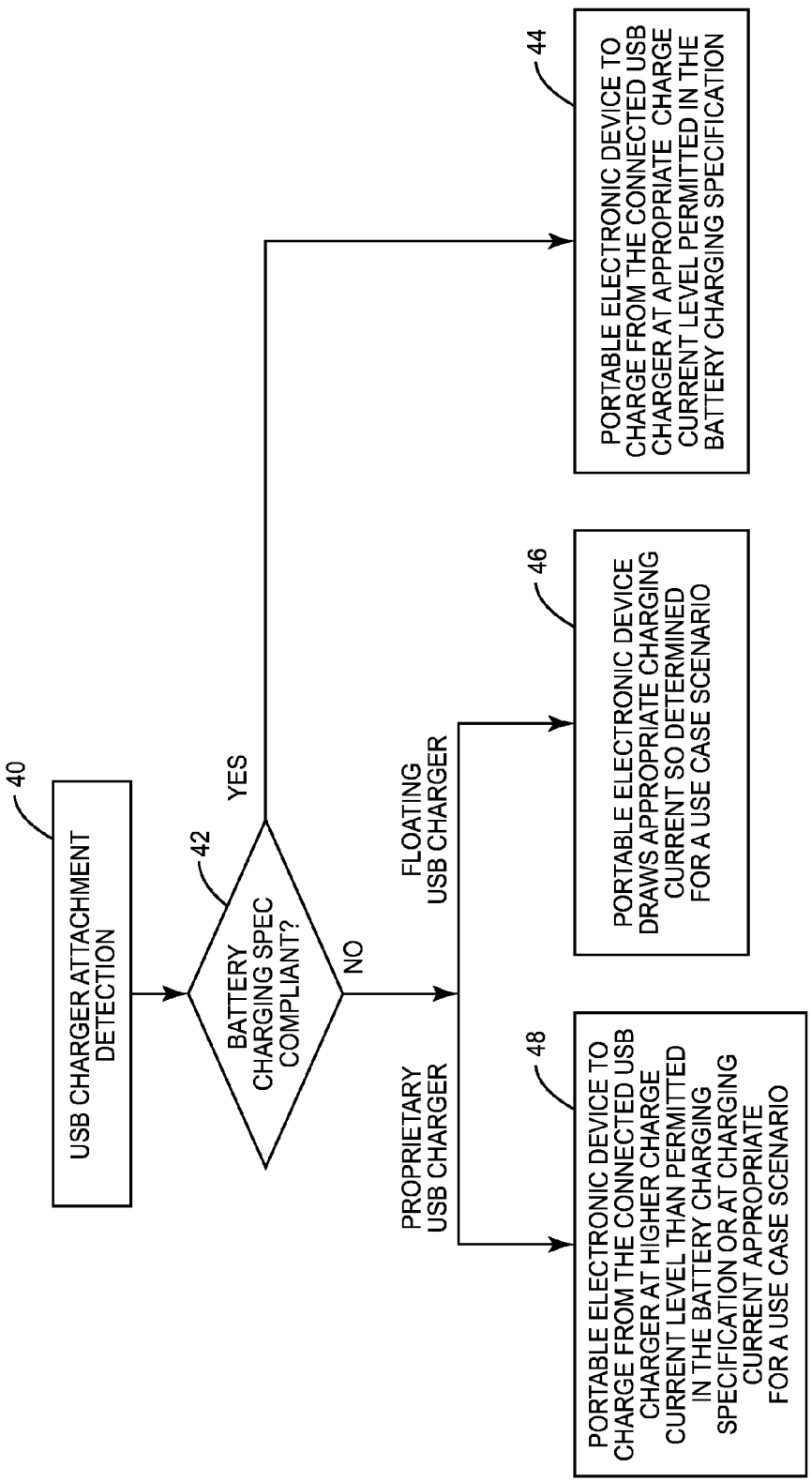
FIG. 2 is a flowchart illustrating an exemplary process for distinguishing among a non-compliant floating USB charger, a non-compliant proprietary USB charger, and a compliant USB charger for regulating charging current.

In this regard, FIG. 2 is a generalized exemplary process for distinguishing between a non-compliant floating USB charger and a non-compliant proprietary USB charger for regulating charging current drawn by a portable electronic device ("portable device"). The portable device is configured to draw a charging current from the USB charger to charge a battery in the portable device for powering operations. A USB charger can be any electronic device that is configured to provide power over a USB connection.

In this regard, with reference to FIG. 2, the attachment or connection of a portable device to a USB charger is detected by the portable device and the USB charger (block 40). For example, a comparison between VBUS and the portable device's internal session valid threshold as prescribed by BC1.2 may be employed to detect connection of the portable device to a USB charger. After detecting an attachment or connection to a USB charger (block 40), the portable device determines if the connected USB charger is in compliance with a specified USB battery charging specification (block 42). For example, the USB battery charging specification may be the Battery Charging Specification 1.2 (BC1.2), which is found at http://www.usb.org/developers/devclass_docs/USB_Battery_Charging_1.2.pdf, incorporated herein by reference in its entirety. If the portable device determines that the connected USB charger is compliant with the USB battery charging specification (block 42), this means that the USB charger is known to comply with the USB battery charging specification (i.e., a "compliant USB charger") and that it is safe for the portable device to request charging current from the USB charger according to the specified limits in the USB battery charging specification. By the portable device identifying the connected USB charger as a compliant USB charger, the portable device can be configured to assume that requesting a charging current at a current level up to a maximum current allowed by the USB battery charging specification is safe. In this regard, the portable device attempts to draw a charging current from the connected compliant USB charger at appropriate current level permitted by the USB battery charging specification for the specific type of USB charger identified by the portable device (block 44).

With continuing reference to FIG. 2, if however, the portable device determines that the connected USB charger is not in compliance with the USB battery charging specification (i.e., a "non-compliant USB charger"), the portable device determines if the connected non-compliant USB charger is a proprietary USB charger (i.e., a "non-compliant proprietary USB charger") or a floating USB charger (i.e., a "non-compliant floating USB charger"). A floating USB charger is a USB charger that is determined to not be compliant with the specified USB battery charging specification based on detecting data pins of its USB receptacle being in a "floating" condition. A "floating" condition means a pin that has a higher impedance than provided in a specified battery charging specification (e.g., greater than 1 MΩ according to BC1.2). A proprietary USB charger has at least one data pin of its USB receptacle that is not floating. A portable device assumes that a floating USB charger does not include current charging limiters that could cause an un-safe condition if the portable device draws more charging current from a floating USB charger than a defined lower threshold charging current of the USB battery charging specification. For example, in BC1.2, the lower threshold charging current is defined as 2.5 mA. However, it can be assumed by a portable device that a proprietary USB charger has current charging limiters allow drawing of charging current greater than the lower threshold charging current of the USB battery charging specification.

In this regard, with continuing reference to FIG. 2, if the connected USB charger is determined to be a non-compliant USB floating charger by the portable device, the portable device draws appropriate charging current so determined for a use case scenario from the connected USB charger (block 46). However, if the connected USB charger is determined to be a non-compliant proprietary USB charger by the portable device, the portable device draws a charging current from the connected USB charger at a higher current level than permitted by the specified USB battery charging specification or at charging current appropriate for a use case scenario (block 48). In BC1.2, the maximum charging current permitted for a SDP is 500 mA. The lower threshold charging current is a charging current specified for a standard downstream port (SDP) in BC1.2, as an example. Thus, by allowing the portable device to draw a charging current greater than the lower threshold charging current for the specified USB battery charging specification if the connected USB charger is detected as a non-compliant, proprietary USB charger, the portable device can charge its battery faster still under safe conditions.

Figure 3:
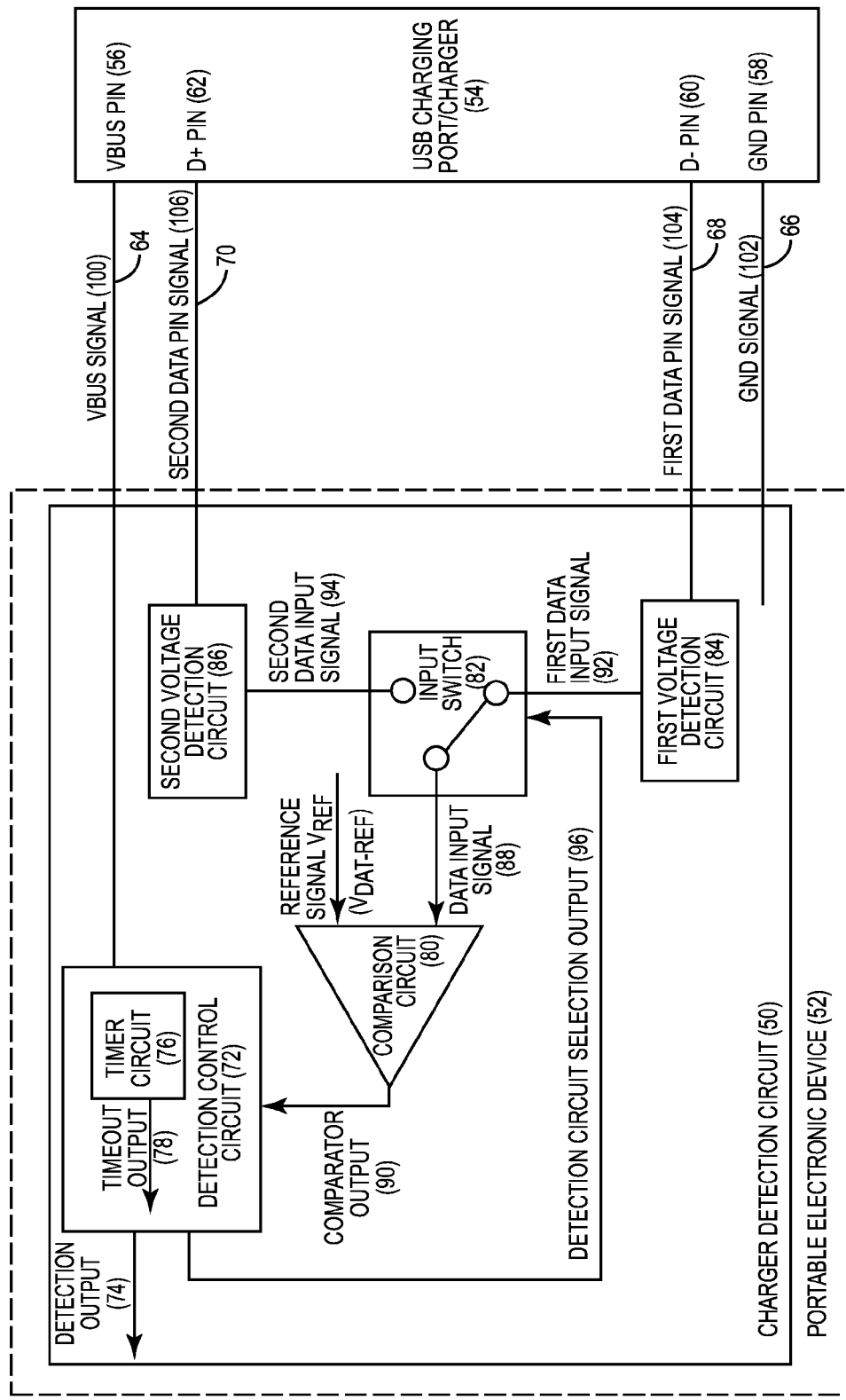
FIG. 3 is a schematic diagram of an exemplary charger detection circuit provided in a USB portable device and configured to distinguish between a connected non-compliant floating USB charger and a connected non-compliant proprietary USB charger.

To further illustrate exemplary mechanisms that can be employed in a portable device for distinguishing between a connected non-compliant proprietary USB charger and a non-compliant floating USB charger, FIG. 3 is provided. FIG. 3 illustrates a schematic diagram of an exemplary charger detection circuit 50 that can be provided or embedded in a portable electronic device 52 (as referred to herein as "portable device 52"). The portable device 52 is shown as being connected to an exemplary USB charging port/charger 54 ("USB charger") through a standard USB cable (not shown in FIG. 3). The USB charger 54 comprises at least a VBUS pin 56, a GND pin 58, a D− pin 60, and a D+ pin 62, which connect respectively with a VBUS signal line 64, a GND signal line 66, a first data pin signal line 68, and a second data pin signal line 70 in a standard USB cable connecting the USB charger 54 to the charger detection circuit 50 in the portable electronic device 52. As described in FIG. 1, the VBUS pin 56 and the GND pin 58 are by design longer than the D− pin 60 and the D+ pin 62. This arrangement is significant in that it allows the portable device 52 to ensure physical attachment to the USB charger 54 before starting the process of detecting data pins (D− pin 60 and D+ pin 62) of the USB charger 54 for further determination of a category of the USB charger 54.

With continuing reference to FIG. 3, a detection control circuit 72 is provided in the charger detection circuit 50 to determine if the connected USB charger 54 is a compliant USB charger with a specified USB battery charging specification, or a non-compliant USB charger. In this example, as will be discussed in more detail below, the detection control circuit 72 is configured to determine if the connected USB charger 54 is a USB charger in compliance with BC1.2, as a non-limiting example. If the connected USB charger 54 is detected as a non-compliant USB charger, the detection control circuit 72 is further configured to determine if the connected non-compliant USB charger is a non-compliant floating USB charger or a non-compliant, proprietary USB charger. The detection control circuit 72 is configured to generate a detection output 74 indicative of the connected USB charger 54 being either a non-compliant floating USB charger or a non-compliant proprietary USB charger. In one aspect, the detection control circuit 72 is configured to receive a VBUS signal 100 that indicates a connection with the VBUS pin 56 of the USB charger 54. Upon reception of the VBUS signal 100, the detection control circuit 72 is configured to compare the VBUS signal 100 against an internal session valid threshold ($V_{OTG\_SESS\_VLD}$) prescribed by BC1.2. If the VBUS signal 100 is greater than the $V_{OTG\_SESS\_VLD}$, it is an indication of physical attachment between the portable device 52 and the USB charger 54. In accordance with the good battery algorithm in BC1.2, the detection control circuit 72 is further configured to initiate a timeout timer enabled by a timer circuit 76 or a software function (not shown) in response to receiving the VBUS signal 100 greater than $V_{OTG\_SESS\_VLD}$, and receive a timeout output 78 from the timer circuit 76 or the software function when the timeout timer expires. According to BC1.2, the timeout timer regulates the duration for detecting the D− pin 60 and the D+ pin 62 of the USB charger 54. In one non-limiting example, the timeout timer is set to a duration of between 300 milliseconds (ms) (inclusive) and 900 ms (inclusive). In another non-limiting example, the timeout timer is set to duration greater than 900 ms and up to a predetermined configurable upper limit (e.g., 2 seconds). According to one aspect of the disclosure, the timeout timer also regulates the duration for completing the process of distinguishing the non-compliant floating USB charger and the non-compliant proprietary USB charger among all other USB chargers.

With continuing reference to FIG. 3, the charger detection circuit 50 in this aspect further comprises a comparison circuit 80, an input switch 82, a first voltage detection circuit 84, and a second voltage detection circuit 86. The comparison circuit 80 is configured to receive a data input signal 88 and a reference signal $V_{REF}$ ($V_{DAT\_REF}$). The comparison circuit 80 is further configured to generate a comparator output 90, which is received by the detection control circuit 72, based on a comparison of the data input signal 88 and the reference signal $V_{REF}$. In a non-limiting example, the data input signal 88 and the reference signal $V_{REF}$ ($V_{DAT\_REF}$) are both voltage signals and the comparator output 90 represents a comparison result of the two input voltage signals. The detection control circuit 72 in this example relies on the comparator output 90 to determine if the USB charger 54 is a non-compliant floating USB charger or a non-compliant proprietary USB charger.

With continuing reference to FIG. 3, the input switch 82 is configured to provide either a first data input signal 92 or a second data input signal 94 as the data input signal 88 in accordance to a detection circuit selection output 96 received from the detection control circuit 72. In this regard, the first voltage detection circuit 84 is configured to receive and measure a first data pin signal 104 and generate the first data input signal 92. The second voltage detection circuit 86 is configured to receive and measure a second data pin signal 106 and generate the second data input signal 94. In another non-limiting example, the first data input signal 92 is voltage signal D− and the second data input signal 94 is voltage signal D+. The process of determining the non-compliant floating USB charger and the non-compliant proprietary USB charger in this example involves selectively comparing the first data input signal 92 and the second data input signal 94 with the reference signal $V_{REF}$. In this regard, the input switch 82 is configured to toggle between the first data input signal 92, which is measured by the first voltage detection circuit 84, and the second data input signal 94, which is measured by the second voltage detection circuit 86. The detection control circuit 72 determines which data input signal is to be compared with the $V_{REF}$ and instructs the input switch 82 to switch to either the first data input signal 92 or the second data input signal 94 by means of detection circuit selection output 96.

Figure 4:
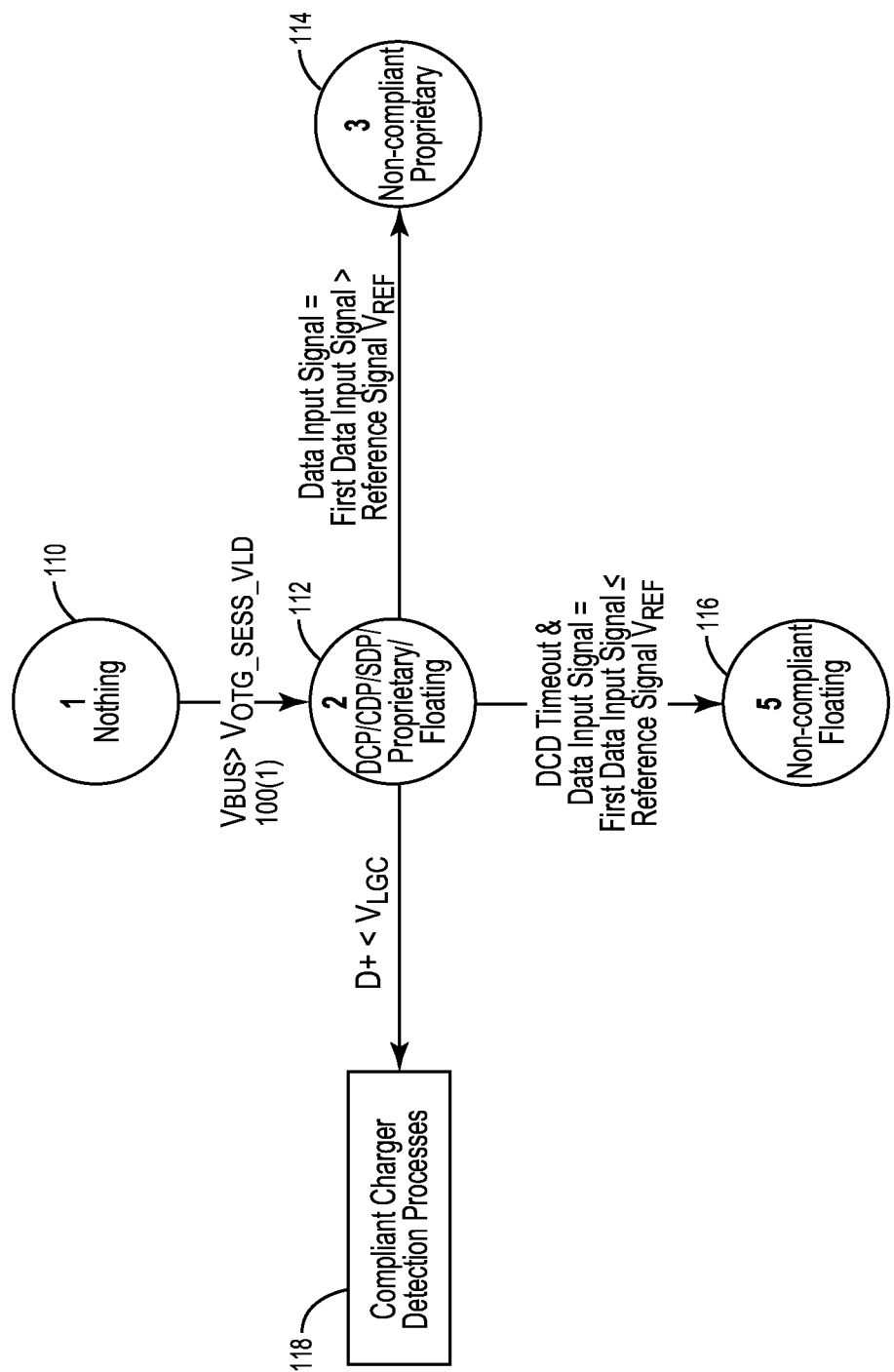
FIG. 4 is a state machine diagram illustrating an exemplary high-level detection process in the charger detection circuit in FIG. 3.

FIG. 4 shows an exemplary process that can be performed by the charger detection circuit 50 of the portable device 52 in FIG. 3 for distinguishing between compliant and non-compliant USB chargers, and for non-compliant USB chargers, between non-compliant floating USB chargers and non-compliant proprietary USB chargers. The process in FIG. 4 will be described below with reference to the portable device 52 and the connected USB charger 54 in FIG. 3. Referring now to FIG. 4, in this example, the detection control circuit 72 transitions from state 1 (block 110) to a state 2 (block 112) when a VBUS signal 100(1) is received and the value of the VBUS signal 100(1) is greater than $V_{OTG\_SESS\_VLD}$, an indication of physical attachment with the USB charger 54 in FIG. 3. By transitioning from state 1 (block 110) to state 2 (block 112), the portable device 52 starts the process of detecting the D− pin 60 and the D+ pin 62 in the USB charger 54 in FIG. 3 as well as the process of distinguishing the non-compliant floating USB charger and the non-compliant proprietary USB charger.

After entering state 2, the detection control circuit 72 initiates the timeout timer in the timer circuit 76. In a non-limiting example, the timeout timer duration is set according to the $T_{DCD\_TIMEOUT}$ in the USB battery charging specification. According to BC1.2, the $T_{DCD\_TIMEOUT}$ is a duration in which the detection control circuit 72 must complete the detection for D− pin 60 and D+ pin 62 in the USB charger 54 in FIG. 3. As a non-limiting example, the detection control circuit 72 is configured to complete the process of distinguishing the non-compliant floating USB charger and the non-compliant proprietary USB charger by the time the timeout time expires.

While in state 2, the detection control circuit 72 is further configured to transmit the detection circuit selection output 96 to the input switch 82 so as to select a data input signal to compare against the reference signal $V_{REF}$. The detection control circuit 72 is configured to use the comparison result of the selected data input signal to the reference signal $V_{REF}$ to distinguish the non-compliant floating USB charger and the non-compliant proprietary USB charger. The detection circuit selection output 96 causes the input switch 82 to select the first data input signal 92 as the data input signal 88 for the comparison circuit 80 to generate a comparison result between the first data input signal 92 and the reference signal $V_{REF}$. The comparison circuit 80 compares the data input signal 88 against the reference signal $V_{REF}$ and generates the comparator output 90 received by the detection control circuit 72. The comparator output 90 indicates whether the data input signal 88 is greater than, or equal to, or smaller than the reference signal $V_{REF}$, which determines if the USB charger 54 is a non-compliant floating USB charger, or a non-compliant proprietary USB charger. In a non-limiting example, the data input signal 88 is the voltage signal D− and the reference signal $V_{REF}$ is $V_{DAT\_REF}$. In contrast, as an example, the prior work uses a different voltage signal, $V_{LGC}$, as the reference signal $V_{REF}$ for detecting non-compliant proprietary USB chargers. Given that the maximum value of $V_{DAT\_REF}$ is 0.4 V, as opposed to the minimum value of 0.8 V for $V_{LGC}$, using $V_{DAT\_REF}$ as the reference signal $V_{REF}$ can detect a large variety of non-compliant proprietary USB chargers that output as low as 0.4V on D−.

With continuing reference to FIG. 4, if the comparator output 90 indicates that the data input signal 88 is greater than the reference signal $V_{REF}$ ($V_{DAT\_REF}$) in state 2, the detection control circuit 72 transitions to state 3 (block 114) in conclusion that the connected USB charger 54 is a non-compliant proprietary USB charger. Otherwise, the detection control circuit 72 in turn makes a comparison between the second data input signal 94 and reference signal $V_{LGC}$ prior to expiration of the timeout timer. In another non-limiting example, the detection control circuit 72 compares $V_{LGC}$ with the voltage signal D+ prior to expiration of $T_{DCD\_TIMEOUT}$. If the detection control circuit 72 receives the timeout output 78 indicating expiration of the timeout timer and the comparator output 90 indicates that the data input signal 88 is less than or equal to the reference signal $V_{REF}$ ($V_{DAT\_REF}$), and the second data input signal 94 is greater than $V_{LGC}$, the detection control circuit 72 transitions to state 5 (block 116) in conclusion that the connected USB charger 54 is a non-compliant floating charger. The connected USB charger 54 cannot be a compliant USB charger because the voltage signal D+ of a compliant USB charger is expected to be less than $V_{LGC}$ at expiration of the timeout timer $T_{DCD\_TIMEOUT}$. Both state 3 and state 5 are terminating states that will cause the detection control circuit 72 to exit the detection process.

With continuing reference to FIG. 4, if the detection control circuit 72 is unable to determine the connected USB charger 54 as either the non-compliant floating USB charger or the non-compliant proprietary USB charger in state 2, the detection control circuit 72 engages in compliant charger detection processes (block 118) to further distinguish the various types of compliant USB chargers. The compliant charger detection processes (block 118) are part of a good battery algorithm in BC1.2. More details about the good battery algorithm will be provided below in later sections of this disclosure.

Figure 5:
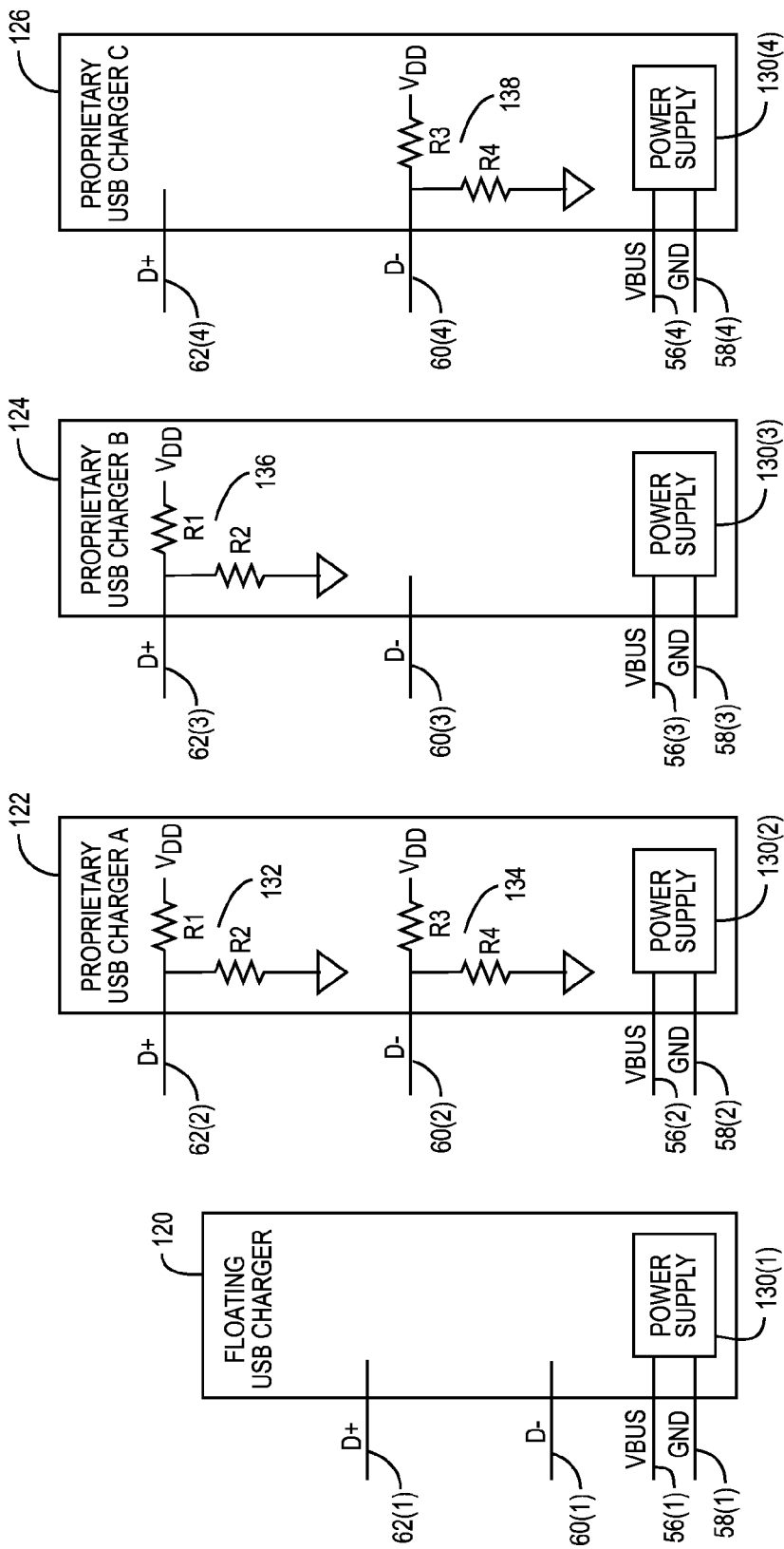
FIG. 5A is an exemplary USB receptacle circuit for a non-compliant floating USB charger.
FIG. 5B is an exemplary USB receptacle circuit for a non-compliant proprietary USB charger that is configured to pull both USB D− and D+ pins to a designated voltage.
FIG. 5C is another exemplary USB receptacle circuit for a non-compliant proprietary USB charger that is configured to pull a D+ pin to a designated voltage while leaving a D− pin floating.
FIG. 5D is another exemplary USB receptacle circuit for a non-compliant proprietary USB charger that is configured to pull a D− pin to a designated voltage while leaving a D+ pin floating.

In further illustrating the exemplary process in FIG. 4 in distinguishing between a non-compliant floating USB charger and a non-compliant proprietary USB charger, FIGS. 5A, 5B, 5C, and 5D illustrate exemplary pin layouts of various non-compliant USB chargers 120, 122, 124, and 126. Common elements of the USB charger 54 in FIG. 3 and the USB chargers 120, 122, 124, and 126 in FIGS. 5A, 5B, 5C, and 5D, respectively, are shown with common element numbers, and thus will not be re-described. FIG. 5A illustrates an exemplary pin layout of a non-compliant floating USB charger 120. The non-compliant floating USB charger 120 comprises a VBUS pin 56(1), a GND pin 58(1), a D− pin 60(1), and a D+ pin 62(1). The VBUS pin 56(1) and the GND pin 58(1) are connected to an exemplary power supply 130(1). The D− pin 60(1) and the D+ pin 62(1) remain floating. FIG. 5B illustrates an exemplary pin layout of a non-compliant proprietary USB charger 122 that comprises a VBUS pin 56(2), a GND pin 58(2), a D− pin 60(2), and a D+ pin 62(2). The VBUS pin 56(2) and the GND pin 58(2) are connected to an exemplary power supply 130(2). The D− pin 60(2) and the D+ pin 62(2) are connected to a first resistor group 132 and a second resistor group 134, respectively. Both the first resistor group 132 and the second resistor group 134 are connected to power source $V_{DD}$. FIG. 5C illustrates an exemplary pin layout of another non-compliant proprietary USB charger 124 that comprises a VBUS pin 56(3), a GND pin 58(3), a D− pin 60(3), and a D+ pin 62(3). The VBUS pin 56(3) and the GND pin 58(3) are connected to an exemplary power supply 130(3). The D+ pin 62(3) is connected to a first resistor group 136 while the D− pin 60(3) is floating. The first resistor group 136 is connected to power source $V_{DD}$. FIG. 5D illustrates an exemplary pin layout of another non-compliant proprietary USB charger 126 that comprises a VBUS pin 56(4), a GND pin 58(4), a D− pin 60(4), and a D+ pin 62(4). The VBUS pin 56(4) and the GND pin 58(4) are connected to an exemplary power supply 130(4). The D− pin 60(4) is connected to a first resistor group 138 while the D+ pin 62(4) is floating. The first resistor group 138 is connected to power source $V_{DD}$.

Figure 6:
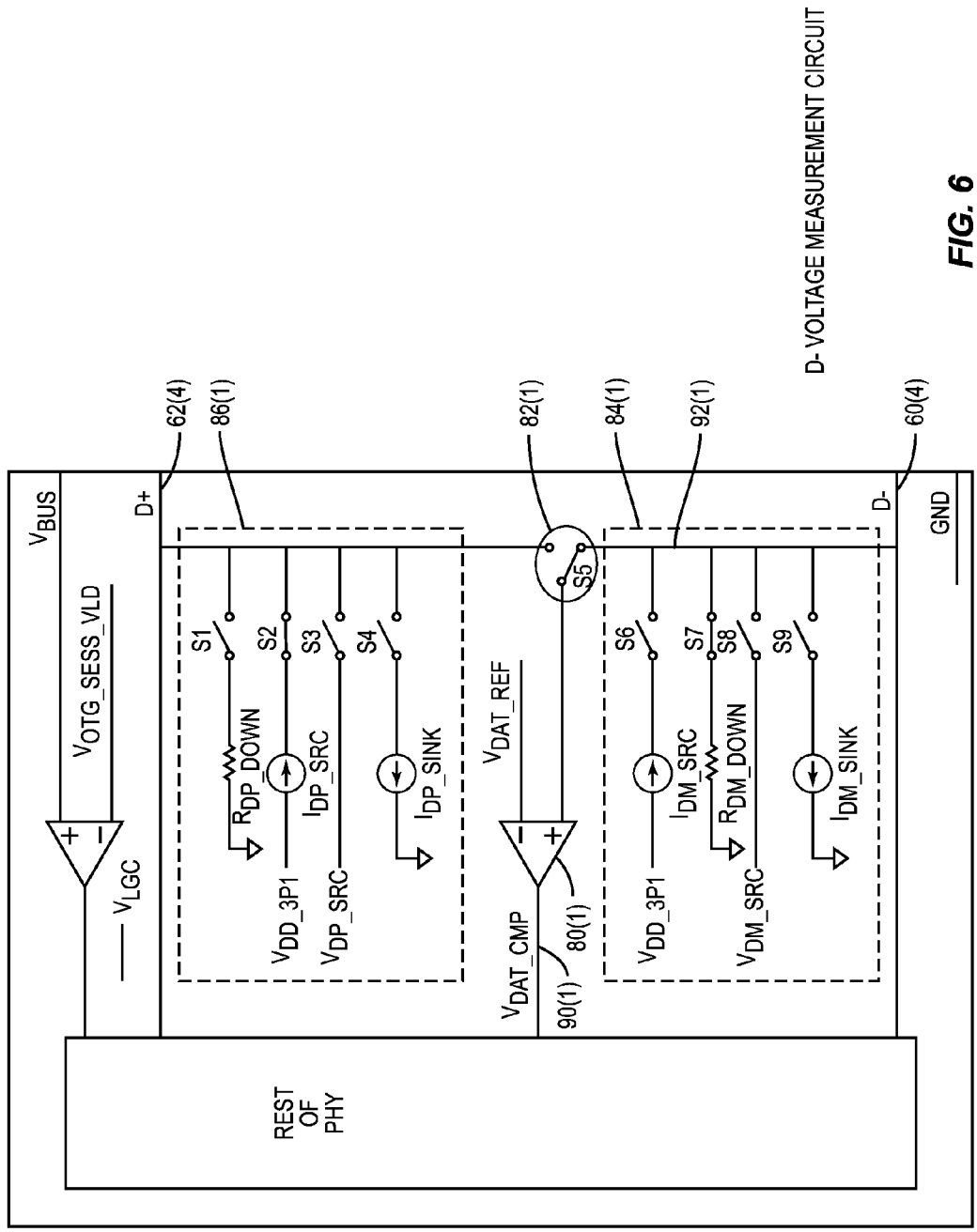
FIG. 6 is an exemplary USB charger detection circuit configured to measure D− voltage.

FIG. 6 illustrates an exemplary voltage measurement circuit that can be provided in the portable device 52 to provide a measurement of the voltage signal D− of a connected USB charger for determining the type of connected USB charger. As previously described in FIG. 4, the voltage signal D− is used in the comparison with the reference signal $V_{REF}$ in determine if the connected USB charger 54 in FIG. 3 is the non-compliant proprietary USB charger. In addition, the voltage signal D+ is also used in further categorizations among the non-compliant floating USB charger and the non-compliant proprietary USB charger. Elements of FIG. 3 are referenced in connection with FIG. 6 and will not be re-described herein. In this aspect, a first voltage detection circuit 84(1) comprises at least a pull down resistance $R_{DM\_DWN}$ and a data contact detection source $I_{DM\_SRC}$. A second voltage detection circuit 86(1) comprises at least a pull down resistance $R_{DP\_DWN}$ and a data contact detection source $I_{DP\_SRC}$. D− and D+ are the D− pin 60(4) and the D+ pin 62(4), respectively, of the connected USB charger 54. In a non-limiting example, measuring D− voltage involves an enabling step (referred to herein as the "step A") and a disabling step (referred to herein as the "step B"). The enabling step A comprises enabling the comparison circuit 80(1), enabling the pull down resistance $R_{DM\_DWN}$ in the first voltage detection circuit 84(1) and enabling the data contact detection source $I_{DP\_SRC}$ in the second voltage detection circuit 86(1). The disabling step B comprises disabling the comparison circuit 80(1), disabling the pull down resistance $R_{DM\_DWN}$ in the first voltage detection circuit 84(1) and disabling the data contact detection source $I_{DP\_SRC}$ in the second voltage detection circuit 86(1). After performing the enabling step A, an electrical circuit is formed so that a measurement of D− voltage can be produced. Referring back to FIGS. 5A, 5B, 5C, and 5D, the D− voltage measurement will vary depending on the different D− pin and D+ pin layouts of the non-compliant floating USB charger 120 and the non-compliant proprietary USB chargers 122, 124, and 126. A relative comparison between the reference signal $V_{DAT\_REF}$ and the D− voltage can thus be used to distinguish one connected USB charger from another.

Also in this example, the first data input signal 92(1), which represents the D− voltage measurement, from the first voltage detection circuit 84(1) is connected to the input switch 82(1). The comparison circuit 80(1) compares the first data input signal 92(1) with the reference signal $V_{DAT\_REF}$ to generate the comparator output 90(1). At this point, the disabling step B is performed to tear down the first electrical circuit between the first voltage detection circuit 84(1), the D− pin 60(4), and the D+ pin 62(4). Note that the D− voltage measurement circuit also includes another reference voltage source $V_{LGC}$. Although it is not used in the D− voltage measurement process, it will be needed for determining if data contact detection succeeded according to BC1.2.

Figure 7:
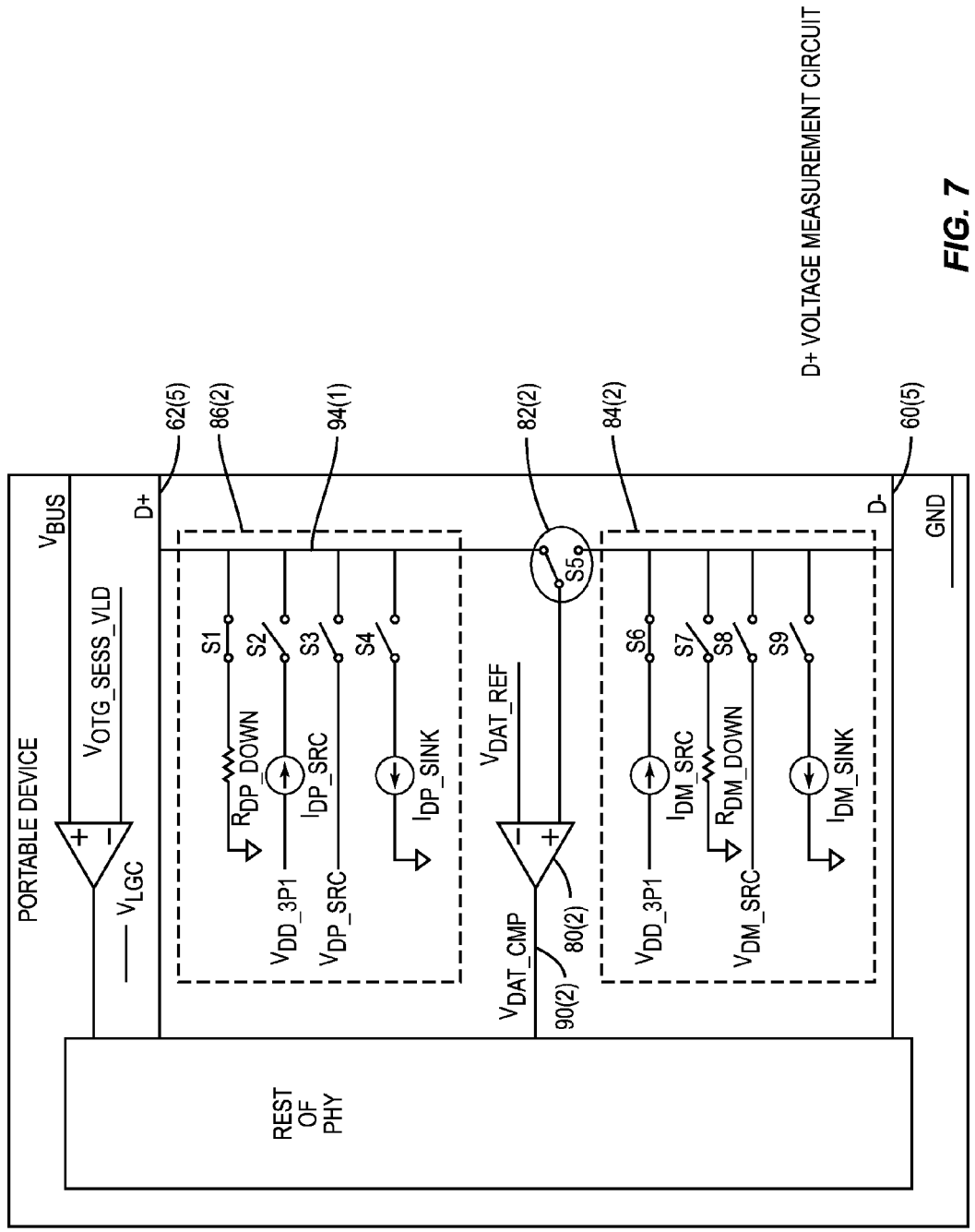
FIG. 7 is an exemplary USB charger detection circuit configured to measure D+ voltage.

FIG. 7 illustrates another exemplary voltage measurement circuit like the exemplary circuit in FIG. 6 that can be provided in the portable device 52 to provide a measurement of the voltage signal of a connected USB charger for detecting the type of connected USB charger. However, the voltage measurement circuit in FIG. 7 is configured to provide a measure of the voltage signal D+ of a connected USB charger, as opposed to the voltage signal D− like in FIG. 6. As previously described in FIG. 4, the voltage signal D+ and/or D− is compared against $V_{LGC}$ to in order to distinguish the non-compliant floating or proprietary USB charger from the compliant USB charger. In addition, the voltage signal D+ and/or D− is also used in further categorizations among the non-compliant floating USB charger and the non-compliant proprietary USB charger. Elements of FIG. 3 are referenced in connection with FIG. 7 and will not be re-described herein.

In this example in FIG. 7, measuring D+ voltage involves an enabling step (referred to herein as the "step C") and a disabling step (referred to herein as the "step D"). The enabling step C comprises enabling the comparison circuit 80(2), enabling the pull down resistance $R_{DP\_DWN}$ in the second voltage detection circuit 86(2) and enabling the data contact detection source $I_{DM\_SRC}$ in the first voltage detection circuit 84(2). The disabling step D comprises disabling the comparison circuit 80(2), disabling the pull down resistance $R_{DP\_DWN}$ in the second voltage detection circuit 86(2) and disabling the data contact detection source $I_{DM\_SRC}$ in the first voltage detection circuit 84(2). After performing the enabling step C, a second electrical circuit (not shown) is formed between the second voltage detection circuit 86(2), the D− pin 60(5), and the D+ pin 62(5) so that a measurement of D+ voltage can be produced. Referring back to FIGS. 5A, 5B, 5C, and 5D, the D+ voltage measurement will vary depending on the different D− pin and D+ pin layouts of the non-compliant floating USB charger 120 and the non-compliant proprietary USB chargers 122, 124, and 126. A relative comparison between the reference signal $V_{DAT\_REF}$ and the D+ voltage can thus be used to distinguish one connected USB charger from another.

Also as illustrated in FIG. 7, the second data input signal 94(1), which represents the D+ voltage measurement, from the second voltage detection circuit 86(2) is connected to the input switch 82(2). The comparison circuit 80(2) compares the second data input signal 94(1) with the reference signal $V_{DAT\_REF}$ to generate the comparator output 90(2). At this point, the disabling step D is performed to tear down the second electrical circuit between the second voltage detection circuit 86(2), the D− pin 60(5), and the D+ pin 62(5). Note that the D+ voltage measurement circuit also includes another reference voltage source $V_{LGC}$. Although it is not used in the D+ voltage measurement process, it will be needed for determining if data contact detection succeeded according to BC1.2.

Figure 8:
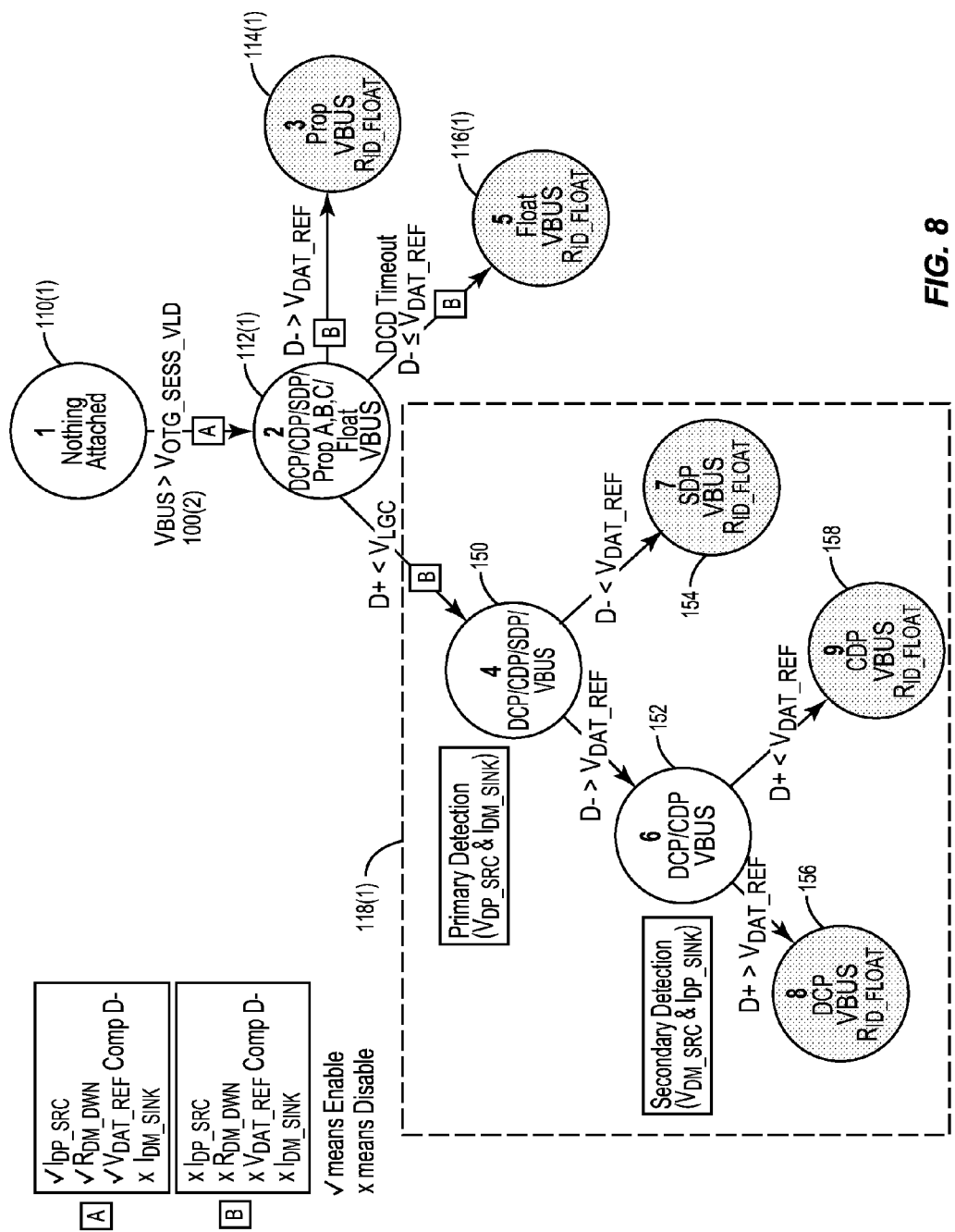
FIG. 8 is a state machine diagram illustrating an exemplary USB charger detection process, which is in compliance with a good battery algorithm of a USB battery charging specification, for distinguishing among a non-compliant proprietary USB charger, non-compliant floating USB charger, and various types of compliant USB chargers.

With continuing reference to FIGS. 4 and 6, FIG. 8 is provided to further illustrate an exemplary process that includes the good battery algorithm/process of a USB battery charging specification, for detecting a compliant USB charger if the USB charger is not detected as either a non-compliant proprietary USB charger or a non-compliant floating USB charger. The compliant charger detection processes (block 118) in FIG. 4 are further described herein. In this aspect, state 1 (block 110(1)) represents the start of the process. A transition from state 1 to state 2 (block 112(1)) takes place when the VBUS signal 100(2) is detected to be greater than $V_{OTG\_SESS\_VLD}$. Prior to entering state 2, the enabling step A (described in FIG. 6) is performed to create the first electrical circuit in order to produce a D− voltage measurement. After entering state 2, the timeout timer is initiated. D− voltage measurement is then monitored and compared to the reference signal $V_{DAT\_REF}$. If the D− voltage is greater than the reference signal $V_{DAT\_REF}$ for a duration of $T_{DCD\_DBNC}$, it is concluded that the connected USB charger is a non-compliant proprietary USB charger and the process transitions from state 2 (block 112(1)) to state 3 (block 114(1)). Otherwise, at expiration of the timeout timer, if the D− voltage is determined to be less than or equal to the reference signal $V_{DAT\_REF}$, this indicates that the connected USB charger is a non-compliant floating USB charger and the process will transition from state 2 (block 112(1)) to state 5 (block 116(1)) as result. Otherwise, if D+ voltage is less than the reference voltage $V_{LGC}$ for the duration of $T_{DCD\_DBNC}$, it can be concluded that the connected USB charger is a type of compliant USB charger and the process will proceed to the compliant battery detection processes (block 118(1)) based on the good battery algorithm of the USB battery charging specification. Upon exiting from state 2, the disabling step B (described in FIG. 6) is performed to tear down the first electrical circuit created in the enabling step A. Both state 3 (block 114(1)) and state 5 (block 116(1)) are terminating states, meaning that the process is terminated in these states.

With continuing reference to FIG. 8, the primary and secondary detection process (block 118(1)) comprises state 4 (block 150), state 6 (block 152), state 7 (block 154), state 8 (block 156), and state 9 (block 158). According to the good battery algorithm, state 4 conducts the primary detection wherein D+ source voltage $V_{DP\_SRC}$ and D− sink current $I_{DM\_SINK}$ are enabled. Further, D− voltage measurement is taken and compared with the reference signal $V_{DAT\_REF}$. If D− voltage is greater than the reference voltage $V_{DAT\_REF}$ for the duration of $T_{DCD\_DBNC}$, the connected USB charger can be determined to be a standard downstream port (SDP) charger and the primary detection process will transition from state 4 to state 7 (block 154). If D− voltage is less than or equal to reference signal $V_{DAT\_REF}$ for the duration of $T_{DCD\_DBNC}$, the detection process transitions to state 6 (block 152) wherein the secondary detection is performed. While in state 6, D− source voltage $V_{DM\_SRC}$ and D+ sink current $I_{DP\_SINK}$ are enabled. Further, D+ voltage measurement is taken and compared with the reference signal $V_{DAT\_REF}$. If D+ voltage is greater than $V_{DAT\_REF}$ for the duration of $T_{DCD\_DBNC}$, the connected USB charger is a dedicated charging port (DCP) charger and the secondary detection process will transition from state 6 (block 152) to state 8 (block 156). If D+ is less than or equal to $V_{DAT\_REF}$ for the duration of $T_{DCD\_DBNC}$, the connected USB charger is a charging downstream port (CDP) charger and the secondary detection will transition from state 6 (block 152) to state 9 (block 158). Note that state 7 (block 154), state 8 (block 156), and state 9 (block 158) are all terminating states as well, indicating that no further detection occurs beyond these states.

Figure 9:
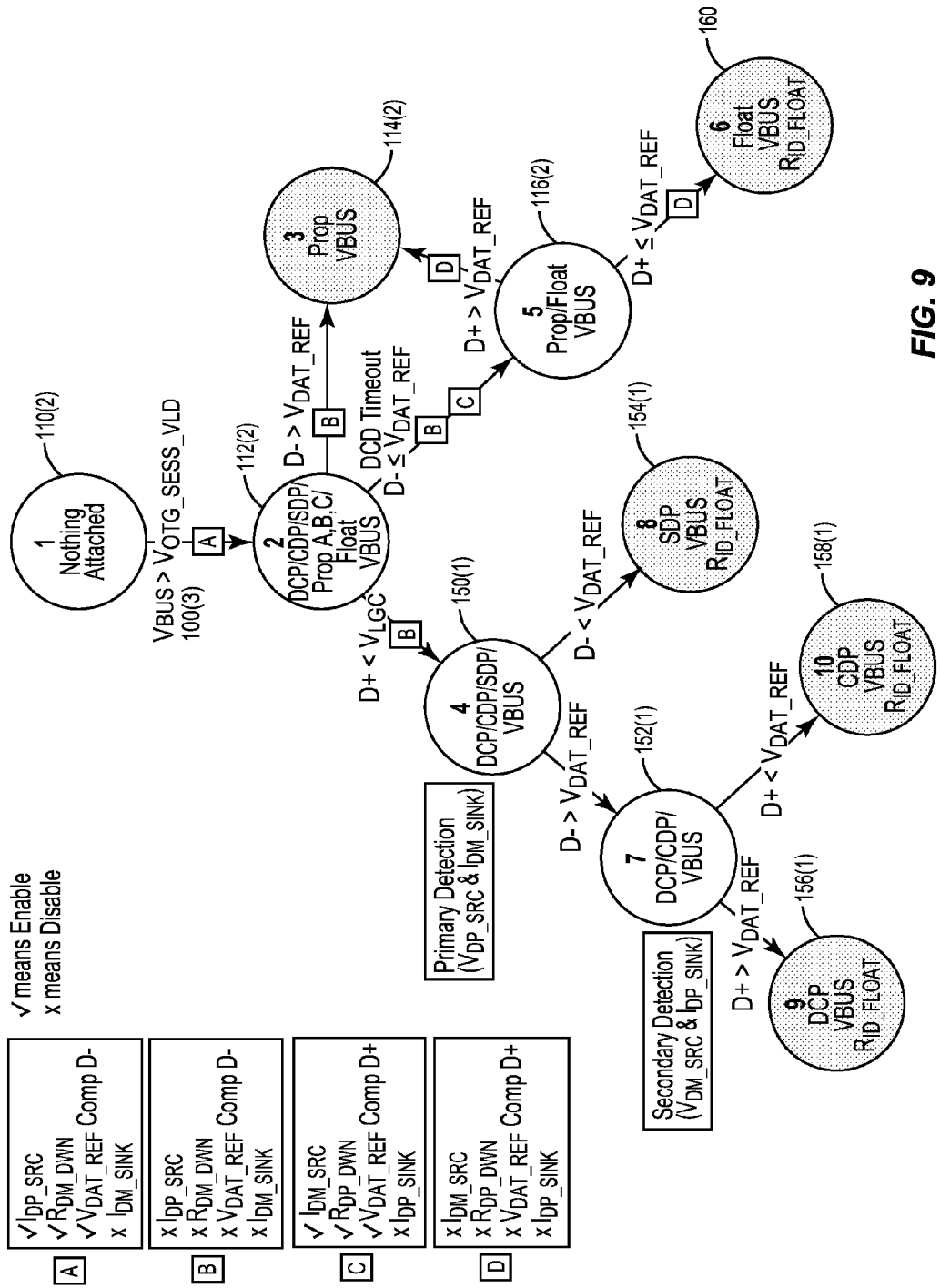
FIG. 9 is a state machine diagram illustrating an exemplary USB charger detection process, which is in compliance with a good battery algorithm of a USB battery charging specification, for further distinguishing between a non-compliant proprietary USB charger and a non-compliant floating USB charger with a floating D− pin.

With reference back to the USB charger D− pin and D+ layouts illustrated in FIG. 5A and FIG. 5C, the non-compliant floating USB charger 120 in FIG. 5A and the non-compliant proprietary USB charger 124 in FIG. 5C both have the D− pins 60(1), 60(3) as floating. The difference between the non-compliant floating USB charger 120 in FIG. 5A and the non-compliant proprietary USB charger 124 in FIG. 5C is in their D+ pins 62(1), 62(3). The non-compliant proprietary USB charger 124 in FIG. 5C has the D+ pin 62(1) pulled down by the first resistor group 136, wherein the D+ pin 62(1) in the non-compliant floating USB charger 120 of FIG. 5A is left floating. The difference between the non-compliant floating USB charger 120 in FIG. 5A and the non-compliant proprietary USB charger 126 in FIG. 5D is in their D− pins 60(1), 60(4). The non-compliant proprietary USB charger 126 in FIG. 5D has the D− pin 60(4) pulled down by the first resistor group 138, wherein the D− pin 60(1) in the non-compliant floating USB charger 120 of FIG. 5A is left floating. In this regard, FIG. 9 illustrates an exemplary process to further distinguish a non-compliant proprietary USB charger that has the D− pin floating from a non-compliant floating USB charger that has both D− and D+ pins floating. In this regard, a further examination of the voltages of the D+ pins 62(1), 62(3), it is able to distinguish the non-compliant proprietary USB charger with its D− and D+ pins configured as in FIG. 5C from the non-compliant floating USB charger with its D− and D+ pins configured as in FIG. 5A.

The detection process of FIG. 9 is built on the detection process of FIG. 8. In this aspect, further determination based on D+ voltage is conducted in state 5 (block 116(2)). Enabling step C (described in FIG. 7) is performed prior to entering state 5 (block 116(2)) from state 2 (block 112(2)) to form the second electrical circuit for D+ voltage measurement. D+ voltage is then compared with the reference signal $V_{DAT\_REF}$. If D+ is greater than $V_{DAT\_REF}$ for the duration of $T_{DCD\_DBNC}$, the connected USB charger is a non-compliant proprietary USB charger and a transition is made from state 5 (block 116(2)) to state 3 (block 114(2)) wherein the detection process is terminated. If D+ is less than or equal to $V_{DAT\_REF}$ for the duration of $T_{DCD\_DBNC}$, the connected USB charger is determined to be a non-compliant floating USB charger and a transition is made from state 5 (block 116(2)) to state 6 (block 160) wherein the detection process is terminated. Upon exiting from state 5 (block 116(2)), disabling step D (described in FIG. 7) is performed to tear down the second electrical circuit formed for D+ voltage measurement. All other states, including state transitions, in FIG. 9 remain identical to those in FIG. 8 and will not be repeated herein for the sake of conciseness.

Figure 10:
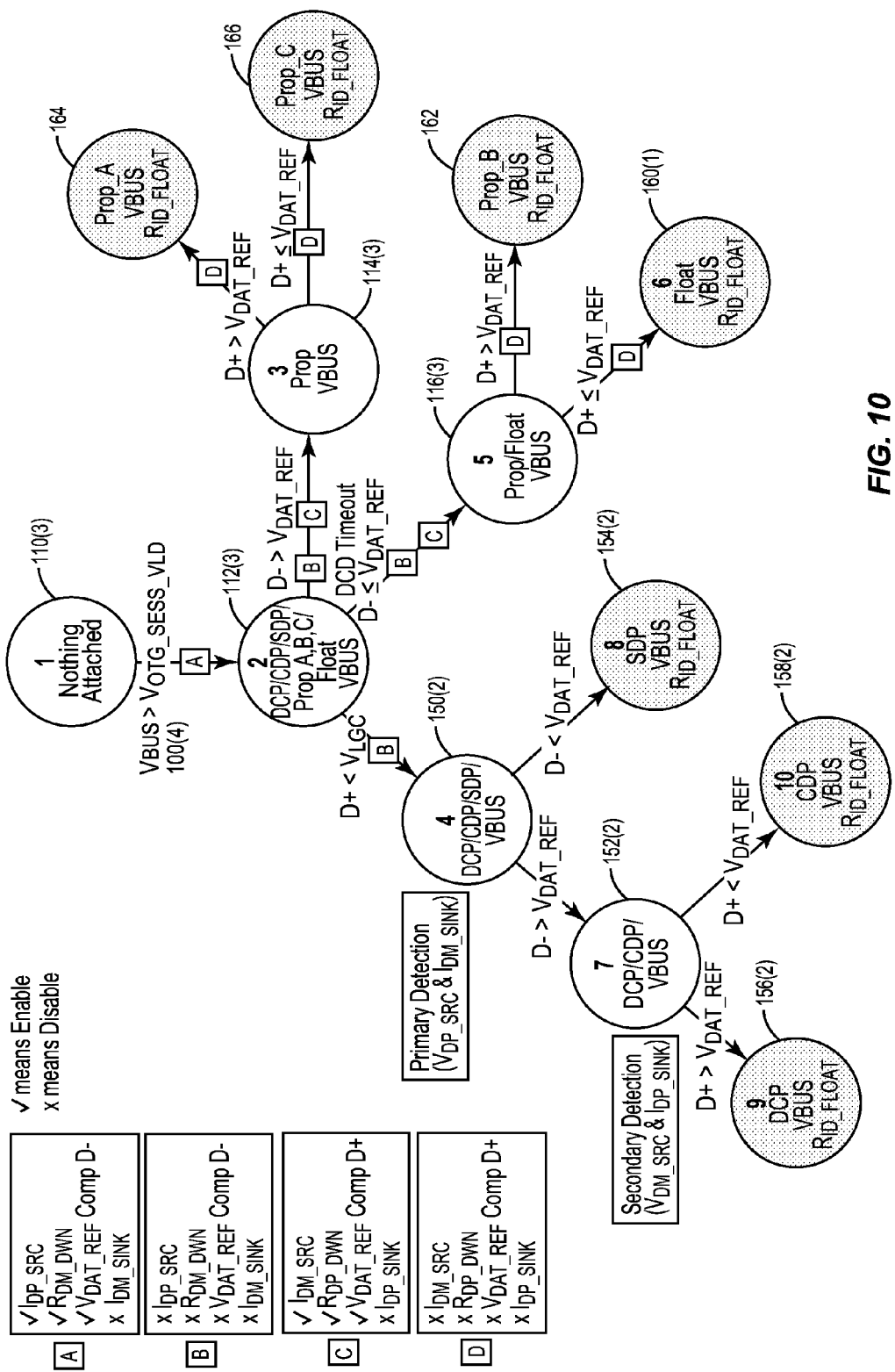
FIG. 10 is a state machine diagram illustrating an exemplary USB charger detection process, which is in compliance with a good battery algorithm of a USB battery charging specification, for further categorizing non-compliant proprietary USB chargers.

FIG. 10 illustrates an exemplary process that provides further distinctions among non-compliant proprietary USB chargers. In this regard, FIG. 10 further extends the process of FIG. 9 by introducing additional determination steps in state 3 (block 114(3)) and state 5 (block 116(3)). The additional steps in state 3 (block 114(3)) further distinguish among the non-compliant proprietary USB chargers with the pin configurations as in FIG. 5B and FIG. 5D. The additional steps in state 5 (block 116(3)) help differentiate the non-compliant proprietary USB charger with pin configuration as in FIG. 5C from the non-compliant floating USB charger with pin configuration as in FIG. 5A. In the aspect herein, enabling step C (described in FIG. 7) is performed when transiting from state 2 (block 112(3)) into state 3 (block 114(3)) so as to form the second electrical circuit for D+ voltage measurement. In state 3 (block 114(3)), a comparison is made between D+ voltage and $V_{DAT\_REF}$. If D+ is greater than $V_{DAT\_REF}$ for the duration of $T_{DCD\_DBNC}$, the connected USB charger is classified as a non-compliant first type proprietary USB charger. Transition is then made from state 3 (block 114(3)) to state Prop_A (block 164) and terminates therein. If D+ is less than or equal to $V_{DAT\_REF}$ for the duration of $T_{DCD\_DBNC}$, the connected USB charger is classified as non-compliant second type proprietary USB charger. Transition is then made from state 3 (block 114(3)) to state Prop_C (block 166) and terminates therein. Upon exiting from state 3 (block 114(3)), disabling step D (described in FIG. 7) is performed to tear down the second electrical circuit formed for D+ voltage measurement.

Also in this exemplary process in FIG. 10, additional determination steps are also introduced in state 5 (block 116(3)). Enabling step C (described in FIG. 7) is performed when transiting from state 2 (block 112(3)) into state 5 (block 116(3)) so as to form the second electrical circuit for D+ voltage measurement. In state 5 (block 116(3)), a comparison is made between D+ voltage and $V_{DAT\_REF}$. If D+ is greater than $V_{DAT\_REF}$ for the duration of $T_{DCD\_DBNC}$, the connected USB charger is classified as a non-compliant third type proprietary USB charger. Transition is then made from state 5 (block 116(3)) to state Prop_B (block 162) and terminates therein. If D+ is less than or equal to $V_{DAT\_REF}$ for the duration of $T_{DCD\_DBNC}$, the connected USB charger is classified as a non-compliant floating USB charger. Transition is then made from state 5 (block 116(3)) to state 6 (block 160(1)) and terminates therein. Disabling step D (described in FIG. 7) is performed when exiting from state 5 (block 116(3)) to tear down the second electrical circuit formed for D+ voltage measurement. In this regard, termination states Prop_A (block 164), Prop_B (block 162), and Prop_C (block 166) correspond to the proprietary USB charger pin configurations illustrated in FIGS. 5B, 5C, and 5D, respectively.

The apparatuses and methods to distinguish proprietary, non-floating and floating USB chargers for regulating charging current according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 11:
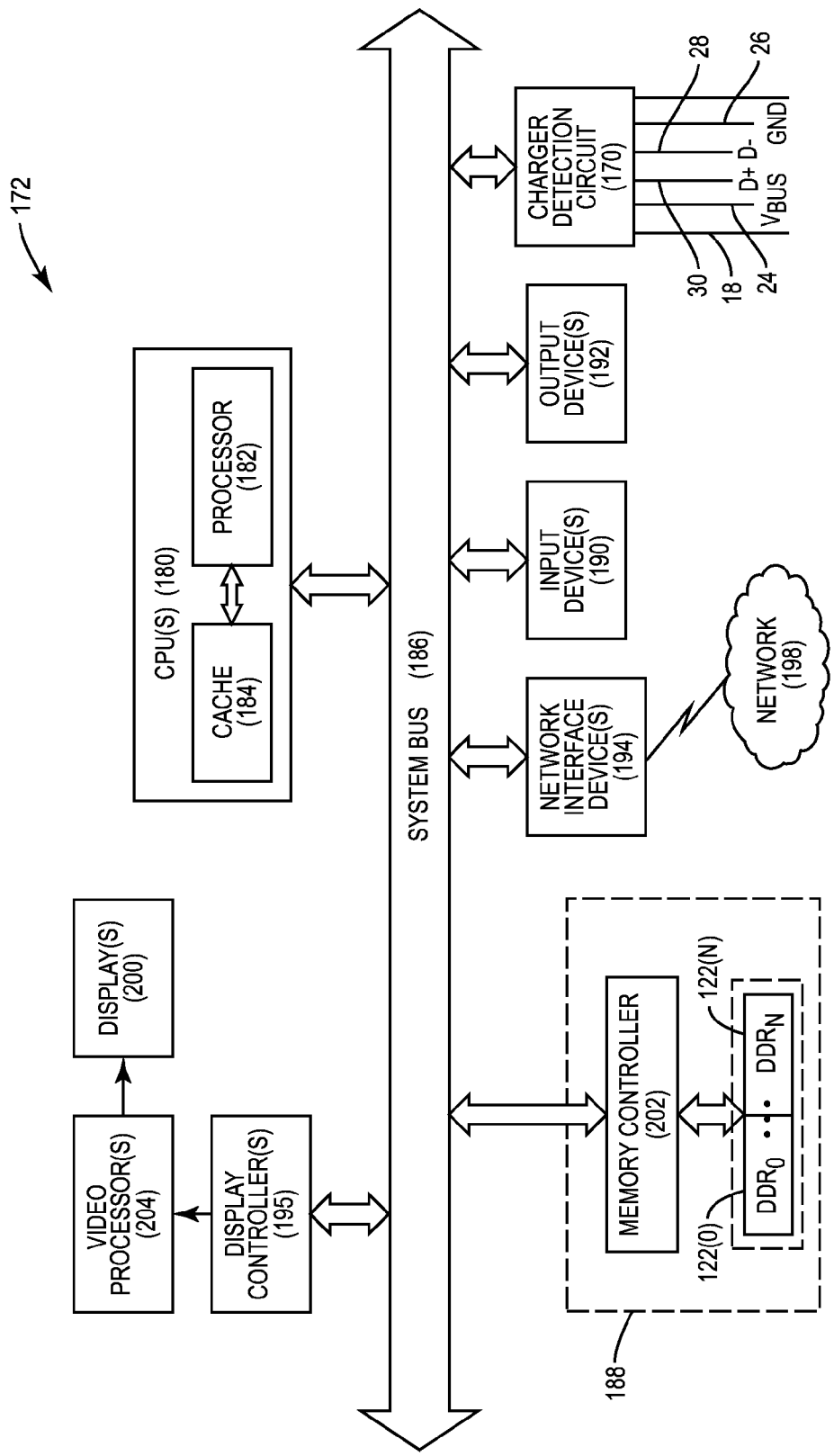
FIG. 11 is a block diagram of an exemplary processor-based portable electronic device that can include the charger detection circuit for detection of compliant and non-compliant USB chargers according to the aspects described herein, including but not limited to implementations of FIGS. 2-10.

In this regard, FIG. 11 illustrates an example of a processor-based portable device that can employ a charger detection circuit to distinguish between a proprietary, non-floating USB charger and floating USB charger for regulating charging current. As one example, the processor-based portable device 170 may be the portable device 52 in FIG. 3. Further, the processor-based portable device 170 may include a charger detection circuit 172, which may be the charger detection circuit 50 in FIG. 3. In this example, the processor-based portable device 170 includes one or more central processing units (CPUs) 180, each including one or more processors 182. The CPU(s) 180 may have cache memory 184 coupled to the processor(s) 182 for rapid access to temporarily stored data. The CPU(s) 180 is coupled to a system bus 186 and can intercouple master and slave devices included in the processor-based portable device 170. As is well known, the CPU(s) 180 communicates with these other devices by exchanging address, control, and data information over the system bus 186. For example, the CPU(s) 180 can communicate bus transaction requests to the charger detection circuit 172 as an example of a slave device. Although not illustrated in FIG. 11, multiple system buses 186 could be provided, wherein each system bus 186 constitutes a different fabric.

Other master and slave devices can be connected to the system bus 186. As illustrated in FIG. 11, these devices can include a memory system 188, one or more input devices 190, one or more output devices 192, one or more network interface devices 194, one or more display controllers 196, and one or more charger detection circuits 172, as examples. The input device(s) 190 can include any type of input device, including but not limited to input keys, switches, voice processors, etc. The output device(s) 192 can include any type of output device, including but not limited to audio, video, other visual indicators, etc. The network interface device(s) 194 can be any devices configured to allow exchange of data to and from a network 198. The network 198 can be any type of network, including but not limited to a wired or wireless network, a private or public network, a local area network (LAN), a wide local area network (WLAN), and the Internet. The network interface device(s) 194 can be configured to support any type of communication protocols desired. The memory system 188 can include one or more memory units 200 (0-N) and memory controllers 202. The charger detection circuit(s) 172 can be configured to attach to a USB cable 18 that has at least a VBUS pin 24, a GND pin 26, a D− pin 28, and a D+ pin 30.

The CPU(s) 180 may also be configured to access the display controller(s) 196 over the system bus 186 to control information sent to one or more displays 202. The display controller(s) 196 sends information to the display(s) 202 to be displayed via one or more video processors 204, which process the information to be displayed into a format suitable for the display(s) 206. The display(s) 206 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master devices, and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A Universal Serial Bus (USB) charger detection circuit, comprising:
    a detection control circuit configured to initiate a timeout timer in response to receipt of a VBUS signal from a connected USB charger and generate a timeout output indicative of an expiration of the timeout timer; and
    a comparison circuit configured to:
        receive a data input signal based on a received USB data pin signal selected between a first data pin signal and a second data pin signal from the connected USB charger;
        receive a reference signal generated in response to detection of the VBUS signal from the connected USB charger; and
        generate a comparator output based on a comparison of the data input signal and the reference signal;
    the detection control circuit is further configured to generate a detection output indicative of the connected USB charger being a proprietary USB charger if the comparator output indicates the data input signal is greater than the reference signal.

2. The USB charger detection circuit of claim 1, wherein the detection control circuit is further configured to generate the detection output indicative of the connected USB charger being the proprietary USB charger that is non-compliant with a USB battery charging specification.

3. The USB charger detection circuit of claim 1, wherein the detection control circuit is configured to generate the detection output indicative of the connected USB charger being the proprietary USB charger if the comparator output indicates a voltage of the data input signal is greater than a voltage of the reference signal.

4. The USB charger detection circuit of claim 1, wherein the detection control circuit is further configured to generate the detection output indicative of the connected USB charger being a floating USB charger, based on the timeout output indicating the expiration of the timeout timer and the comparator output indicating the data input signal is less than or equal to the reference signal.

5. The USB charger detection circuit of claim 4, wherein the detection control circuit is further configured to generate the detection output indicative of the connected USB charger being the floating USB charger, based on the comparator output indicating a voltage of the data input signal is less than or equal to a voltage of the reference signal.

6. The USB charger detection circuit of claim 1, wherein:
    the comparison circuit is further configured to:
        selectively receive a second data input signal based on the second data pin signal from the connected USB charger; and
        generate the comparator output based on a comparison of the second data input signal and the reference signal; and
    the detection control circuit is further configured to:
        generate the detection output indicative of the connected USB charger being a first type proprietary USB charger if the comparator output indicates that the second data input signal is greater than the reference signal; and
        generate the detection output indicative of the connected USB charger being a second type proprietary USB charger different from the first type proprietary USB charger, if the comparator output indicates that the second data input signal is less than or equal to the reference signal.

7. The USB charger detection circuit of claim 4, wherein the comparison circuit is further configured to:
selectively receive a second data input signal based on the second data pin signal from the connected USB charger; and
generate the comparator output based on a comparison of the second data input signal and the reference signal; and
the detection control circuit is further configured to generate the detection output indicative of the connected USB charger being a third type proprietary USB charger based on the timeout output indicating the expiration of the timeout timer and the comparator output indicating the second data input signal is greater than the reference signal.

8. The USB charger detection circuit of claim 1, wherein the detection control circuit is further comprised of a timer circuit comprising the timeout timer having a timeout duration, the timer circuit configured to generate the timeout output indicative of the expiration of the timeout timer.

9. The USB charger detection circuit of claim 8, wherein the timer circuit is implemented as a software function.

10. The USB charger detection circuit of claim 8, wherein the timeout duration is up to a predetermined configurable upper limit.

11. The USB charger detection circuit of claim 1, further comprising:
an input switch configured to:
selectively receive the data input signal as either a first data input signal based on a received first data pin signal or a second data input signal based on a received second data pin signal based on a detection circuit selection output; and
provide the first data input signal or the second data input signal as the data input signal received by the comparison circuit;
the detection control circuit is further configured to generate the detection circuit selection output to control a selective receipt of the first data input signal based on the received first data pin signal or the second data input signal based on the received second data pin signal by the comparison circuit as the data input signal.

12. The USB charger detection circuit of claim 1, further comprising a first voltage detection circuit configured to generate a first data input signal based on a voltage measurement of the first data pin signal.

13. The USB charger detection circuit of claim 12, wherein the first voltage detection circuit further comprises a pull down resistance ($R_{DM\_DWN}$) and a data contact detection source ($I_{DM\_SRC}$) configured to:
form a first electrical circuit with the connected USB charger for detecting the first data pin signal of the connected USB charger; and
tear down the first electrical circuit with the connected USB charger after detecting the first data pin signal of the connected USB charger.

14. The USB charger detection circuit of claim 12, further comprising a second voltage detection circuit configured to generate a second data input signal based on a voltage measurement of the second data pin signal.

15. The USB charger detection circuit of claim 14, wherein the second voltage detection circuit further comprises a pull down resistance ($R_{DP\_DWN}$) and a data contact detection source ($I_{DM\_SRC}$) configured to:
form a second electrical circuit with the connected USB charger for detecting the second data pin signal of the connected USB charger; and
tear down the second electrical circuit with the connected USB charger after detecting the second data pin signal of the connected USB charger.

16. The USB charger detection circuit of claim 1, wherein the data input signal is based on the first data pin signal.

17. The USB charger detection circuit of claim 1, wherein the data input signal is based on the second data pin signal.

18. The USB charger detection circuit of claim 6, wherein a first data input signal is based on the first data pin signal generated from a D– pin of the connected USB charger, and the second data input signal is based on the second data pin signal generated over a D+ pin of the connected USB charger.

19. The USB charger detection circuit of claim 6, wherein the reference signal is comprised of $V_{DAT\_REF}$ according to a battery charging specification.

20. The USB charger detection circuit of claim 1 integrated into a device selected from the group consisting of a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

21. A Universal Serial Bus (USB) charger detection circuit, comprising:
a means for comparison, comprising:
receiving a data input signal based on a received USB data pin signal selected between a first data pin signal and a second data pin signal from a connected USB charger;
receiving a reference signal generated in response to detection of a VBUS signal from the connected USB charger; and
generating a comparator output based on a comparison of the data input signal and the reference signal; and
a means for detection, comprising:
initiating a timeout timer in response to receipt of the VBUS signal from the connected USB charger and generating a timeout output indicative of an expiration of the timeout timer; and
generating a detection output indicative of the connected USB charger being a proprietary USB charger if the comparator output indicates the data input signal is greater than the reference signal.

22. A method for distinguishing between a proprietary Universal Serial Bus (USB) charger and a floating USB charger, comprising:
initiating a timeout timer in response to receipt of a VBUS signal from a USB charger and generating a timeout output indicative of an expiration of the timeout timer;
receiving a data input signal based on a received USB data pin signal from a connected USB charger;
receiving a reference signal generated in response to detection of the VBUS signal from the USB charger;
generating a comparator output based on a comparison of the data input signal and the reference signal;
generating a detection output indicative of the connected USB charger being a proprietary USB charger if the comparator output indicates the data input signal is greater than the reference signal; and generating the detection output indicative of the connected USB charger being a floating USB charger, based on the timeout output indicating the expiration of the timeout timer and the comparator output indicating the data input signal is less than or equal to the reference signal.

23. The method of claim 22, comprising generating the detection output indicative of the connected USB charger being the proprietary USB charger if the comparator output indicates a voltage of the data input signal is greater than a voltage of the reference signal.

24. The method of claim 22, further comprising generating the detection output indicative of the connected USB charger being the floating USB charger, based on the timeout output indicating the expiration of the timeout timer and the comparator output indicating the data input signal is less than or equal to the reference signal.

25. The method of claim 22, further comprising:
selectively receiving a second data input signal based on a second data pin signal from the connected USB charger;
generating the comparator output based on a comparison of the second data input signal and the reference signal;
generating the detection output indicative of the connected USB charger being a first type proprietary USB charger if the comparator output indicates that the second data input signal is greater than the reference signal; and
generating the detection output indicative of the connected USB charger being a second type proprietary USB charger different from the first type proprietary USB charger, if the comparator output indicates that the second data input signal is less than or equal to the reference signal.

26. The method claim 24, further comprising:
selectively receiving a second data input signal based on a second data pin signal from the connected USB charger;
generating the comparator output based on a comparison of the second data input signal and the reference signal; and
generating the detection output indicative of the connected USB charger being a third type proprietary USB charger based on the timeout output indicating the expiration of the timeout timer and the comparator output indicating the second data input signal is greater than the reference signal.

27. The method of claim 22, further comprising:
drawing an appropriate charging current according to a use case and policy if the connected USB charger is the floating USB charger; and
drawing the appropriate charging current according to the use case and policy if the connected USB charger is the proprietary USB charger.

28. The method of claim 27, further comprising drawing a charging current greater than a lower threshold charging current according to a battery charging specification if the connected USB charger is the proprietary USB charger.

29. The method of claim 22, further comprising:
generating a detection circuit selection output to selectively receive a first data input signal or a second data input signal as the data input signal;
selectively receiving the data input signal as either the first data input signal or the second data input signal based on the detection circuit selection output; and
providing the first data input signal or the second data input signal as the data input signal.

30. A method for distinguishing between a proprietary Universal Serial Bus (USB) charger and a floating USB charger, comprising:
initiating a timeout timer in response to receipt of a VBUS signal from a connected USB charger and generating a timeout output indicative of an expiration of the timeout timer;
receiving a data input signal based on a received USB data pin signal selected between a first data pin signal and a second data pin signal from the connected USB charger;
receiving a reference signal generated in response to detection of the VBUS signal from the connected USB charger;
generating a comparator output based on a comparison of the data input signal and the reference signal;
generating a detection output indicative of the connected USB charger being a proprietary USB charger if the comparator output indicates the data input signal is greater than the reference signal; and
generating the detection output indicative of the connected USB charger being a floating USB charger, based on the timeout output indicating the expiration of the timeout timer and the comparator output indicating the data input signal is less than or equal to the reference signal.

* * * * *